(12) United States Patent
Su

(10) Patent No.: US 6,894,296 B2
(45) Date of Patent: May 17, 2005

(54) MULTI-INLET PFS ARC CHAMBER FOR HI-CURRENT IMPLANTER

(75) Inventor: Kuo-Hsiung Su, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 172 days.

(21) Appl. No.: 10/208,240

(22) Filed: Jul. 30, 2002

(65) Prior Publication Data

US 2004/0020433 A1 Feb. 5, 2004

(51) Int. Cl.⁷ .............................................. H01J 37/00
(52) U.S. Cl. ................ 250/492.3; 250/427; 250/492.21
(58) Field of Search .................. 250/492.21, 492.3, 250/427, 423 R; 118/723 R, 723 HC, 715; 315/111.11, 111.21, 111.41, 111.81, 111.91

(56) References Cited

U.S. PATENT DOCUMENTS

| | | | | |
|---|---|---|---|---|
| 3,851,140 A | * | 11/1974 | Coucher | 219/121.59 |
| 4,819,579 A | * | 4/1989 | Jenkins | 118/728 |
| 4,820,371 A | * | 4/1989 | Rose | 156/345.51 |
| 5,399,871 A | * | 3/1995 | Ito et al. | 250/492.21 |
| 5,801,489 A | * | 9/1998 | Chism et al. | 315/111.21 |
| 5,892,232 A | * | 4/1999 | Tsai et al. | 250/426 |
| 5,959,305 A | * | 9/1999 | Mack et al. | 250/492.21 |
| 6,313,428 B1 | * | 11/2001 | Chen et al. | 219/121.43 |
| 6,409,837 B1 | * | 6/2002 | Hillman | 118/712 |
| 6,451,674 B1 | * | 9/2002 | Niwayama et al. | 438/516 |
| 6,475,284 B1 | * | 11/2002 | Moore et al. | 118/715 |
| 6,545,419 B2 | * | 4/2003 | Vella | 315/111.21 |
| 6,627,901 B2 | * | 9/2003 | Martinez | 250/427 |
| 6,646,268 B2 | * | 11/2003 | Murakoshi et al. | 250/427 |
| 6,651,582 B2 | * | 11/2003 | Sakai et al. | 118/723 R |

FOREIGN PATENT DOCUMENTS

JP          62-13573      * 1/1987

* cited by examiner

Primary Examiner—Richard Bueker
(74) Attorney, Agent, or Firm—Tung & Associates

(57) ABSTRACT

A multi-inlet arc chamber typically used in the emission of electrons from a plasma-forming gas in a plasma flood system. The chamber includes multiple gas inlet openings for flow of the gas into the chamber to increase turbulent flow of the gas in the chamber. Over time, the turbulent-flowing gas tends to contact various points rather than the same point or points on a filament in the chamber, as electrical current flows through the filament and electrons are emitted from the gas typically for the neutralization of positive charges on an ion-implanted semiconductor wafer substrate. Consequently, the filament is less susceptible to burnout and breakage and has an extended lifetime.

7 Claims, 2 Drawing Sheets

MULTI-INLET PFS ARC CHAMBER FOR HI-CURRENT IMPLANTER

FIELD OF THE INVENTION

The present invention relates to hi-current implanters used to implant ions in semiconductor wafer substrates in the fabrication of semiconductor integrated circuits. More particularly, the present invention relates to a PFS (plasma flood system) arc chamber having multiple gas inlet openings to facilitate turbulent flow of gas in the chamber during the emission of charge-neutralizing electrons from the gas.

BACKGROUND OF THE INVENTION

In the semiconductor production industry, various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Ion implantation is another processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the substrate. Finally, the doped silicon substrate is subjected to a thermal anneal step to activate the dopant ions.

A phenomenon which commonly results from the ion implantation process is wafer charging, in which positive ions from the ion beam strike the wafer and accumulate in the masking layer. This can cause an excessive charge buildup on the wafer, leading to charge imbalances in the ion beam and beam blow-up, which results in substantial variations in ion distribution across the wafer. The excessive charge buildup can also damage surface oxides, including gate oxides, leading to device reliability problems, as well as cause electrical breakdown of insulating layers within the wafer and poor device yield.

Wafer charging is controlled using a plasma flood system, in which the wafer is subjected to a stable, high-density plasma environment. Low-energy electrons are extracted from an argon or xenon plasma in an arc chamber and introduced into the ion beam, which carries the electrons to the wafer so that positive surface charges on the wafer are neutralized. The energy of the electrons is sufficiently low to prevent negative charging of the wafer.

A typical conventional PFS (plasma flood system) for neutralizing positive charges on ion-implanted wafers is generally indicated by reference numeral 10 in FIG. 1 and includes an arc chamber 12 having a cylindrical chamber wall 14. A single gas inlet opening 18 is provided in the chamber wall 14. A low voltage source 20 generates a typically 3-volt, 200-amp current through a tungsten filament 22 positioned in the chamber interior 13. Pressure inside the chamber interior 13 is maintained at about 5 Torr. Simultaneously, by operation of vacuum pressure applied through a vacuum opening 24 in the bottom of the arc chamber 12, a plasma-forming gas such as argon or xenon is introduced into the chamber interior 13 through the single gas opening 18, at a flow rate of typically about 1.2 sccm. The filament 22, heated by the low-voltage current from the current source 20, causes thermionic emission of electrons from the flowing gas as the gas contacts the filament 22. The electrons from the gas are electrically attracted to the positively-charged chamber walls 14, which function as an anode. A torroidal magnet 16 generates a magnetic field which causes the electrons to travel in a spiral flight path in the chamber interior 13, and this increases the frequency of collisions between the electrons and the gas atoms, resulting in the creation of additional free electrons. The electrons and positive ions are drawn from the chamber interior 13 through the vacuum opening 24, where the electrons and cations enter an ion beam 26. The ion beam 26 carries the electrons into contact with a semiconductor wafer 28 which was previously subjected to an ion implantation process. Accordingly, the electrons contact the wafer 28 and neutralize positive ions remaining on the surface of the wafer 28 after the ion implantation process.

A common characteristic of the conventional arc chamber 12 is that the single gas inlet opening 18 facilitates orderly spiral flow of the argon or xenon gas in the chamber interior 13. Consequently, the plasma-forming gas continually contacts the same point or points on the filament 22 in transit to the vacuum opening 24. This is illustrated in FIG. 2A, in which the flowing gas continually contacts the same point 23 on the filament 22 and, after a relatively short period of operation, causes burnout and breakage of the filament 22 at the point of contact 23. Consequently, the filament 22 must be replaced typically after about 18 days of operation.

As illustrated in FIG. 2B, one way to prevent continuous contact of the gas with the burnout-prone points on the filament 22 is to raise the position of the filament 22 in the chamber interior 13. However, when the filament 22 is disposed in this raised configuration, much of the gas fails to adequately contact the filament 22 for emission of electrons from the gas, as shown by the gas flow path 30.

As illustrated in FIG. 2C, another problem frequently associated with the conventional arc chamber 12 is that the chamber wall 14 at the single gas inlet opening 18 becomes damaged or deteriorated after prolonged use. This causes distortion of the gas flow path 30 to a sharp downward trajectory, such that a large portion of the flowing gas fails to contact the filament 22. Consequently, emission of electrons from the gas is substantially reduced.

It has been found that providing multiple gas entry openings in the chamber wall around the circumference of the arc chamber enhances turbulent flow of the plasma-forming gas in the chamber interior and eliminates continuous contact of the gas with the same point or points on the filament during electron emission. Consequently, the lifetime of the filament is significantly extended.

Accordingly, an object of the present invention is to provide a new and improved arc chamber which prolongs the lifetime of a filament in the emission of electrons from a plasma-forming gas.

Another object of the present invention is to provide a new and improved arc chamber having multiple gas inlet openings for facilitating turbulent flow of plasma-forming gas in an arc chamber of a plasma flood system for ion implanters.

Still another object of the present invention is to provide a multi-inlet arc chamber which prevents premature burnout and breakage of a PFS (plasma flood system) filament in the emission of wafer-neutralizing electrons from a plasma-forming gas flowing into the arc chamber through multiple gas inlet openings.

Yet another object of the present invention is to provide a multi-inlet arc chamber for a PFS system, which arc chamber may have a selected number of multiple gas inlet openings for the introduction of a plasma-forming gas into the chamber.

Another object of the present invention is to provide a multi-inlet arc chamber which may be used to prolong the lifetime of a filament in a plasma flood system for hi-current implanters.

A still further object of the present invention is to provide a method of prolonging the lifetime of a filament used in the emission of electrons from a gas.

Another object of the present invention is to provide a method which may include providing multiple gas inlet openings in an arc chamber in combination with a high gas flow rate to facilitate turbulent flow of a gas through the arc chamber and prevent excessive burnout and breakage of an electrical current filament in the chamber.

SUMMARY OF THE INVENTION

In accordance with these and other objects and advantages, the present invention comprises a multi-inlet arc chamber typically used in the emission of electrons from a plasma-forming gas in a plasma flood system. The chamber includes multiple gas inlet openings for flow of the gas into the chamber to increase turbulent flow of the gas in the chamber. Over time, the turbulent-flowing gas tends to contact various points rather than the same point or points on a filament in the chamber, as electrical current flows through the filament and electrons are emitted from the gas typically for the neutralization of positive charges on an ion-implanted semiconductor wafer substrate. Consequently, the filament is less susceptible to burnout and breakage and has an extended lifetime.

BRIEF DESCRIPTION OF THE DRAWINGS

The invention will now be described, by way of example, with reference to the accompanying drawings, wherein.

DESCRIPTION OF THE PREFERRED EMBODIMENTS

The present invention has particularly beneficial utility in preventing premature burnout and breakage of PFS current filaments in plasma flood systems for hi-current implanters. However, the invention is not so limited in application, and while references may be made to such plasma flood systems and hi-current implanters, the invention may be applicable to preventing premature burnout and breakage of current filaments in a variety of applications.

Figure 1:
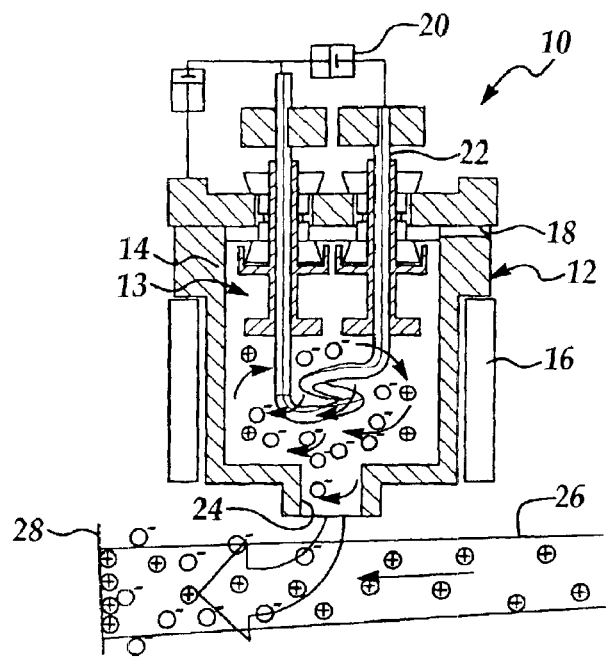
FIG. 1 illustrates a typical conventional plasma flood system.
Figure 2A:
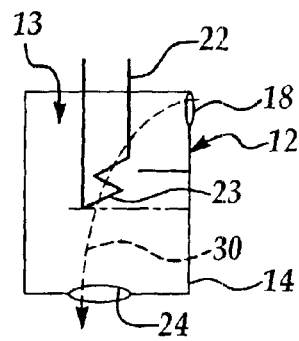
FIG. 2A illustrates a typical gas flow path in operation of a single-inlet arc chamber of a conventional plasma flood system.
Figure 2B:
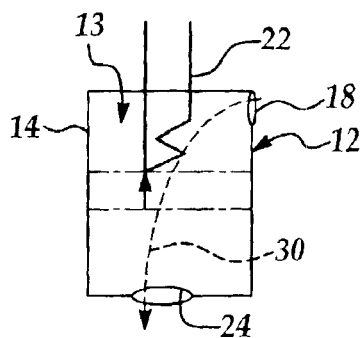
FIG. 2B illustrates raising of a filament in a single-inlet arc chamber of a conventional plasma flood system to prevent continuous contact of a gas with the same point or points on the filament and premature burnout and breakage of the filament.
Figure 2C:
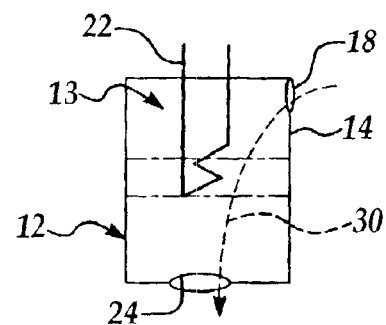
FIG. 2C illustrates a distorted gas flow path through an arc chamber of a conventional plasma flood system as a result of distortion of the single gas inlet opening in the chamber.
Figure 3:
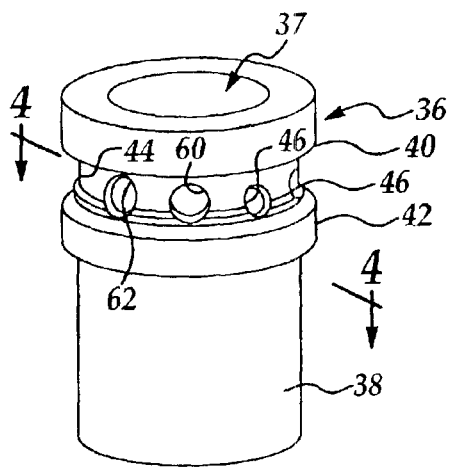
FIG. 3 is a perspective view of a multi-inlet arc chamber of the present invention.

An illustrative embodiment of the arc chamber of the present invention is generally indicated by reference numeral 36 in FIG. 3 and includes a cylindrical chamber wall 38 that typically is lined with graphite and defines a chamber interior 37. The arc chamber 36 may have a design which is similar to the PFS arc chamber used in high current implanters sold by the Applied Materials Corp. of Santa Clara, Calif., wherein the chamber wall 38 defines an upper flange 40 and a lower flange 42 separated by a neck 44. However, it is understood that the arc chamber 36 of the present invention may have any alternative configuration which is consistent with its function. A chamber bottom 39 closes the bottom end of the chamber wall 38, and a central vacuum opening 52 extends through the chamber bottom 39.

Figure 4:
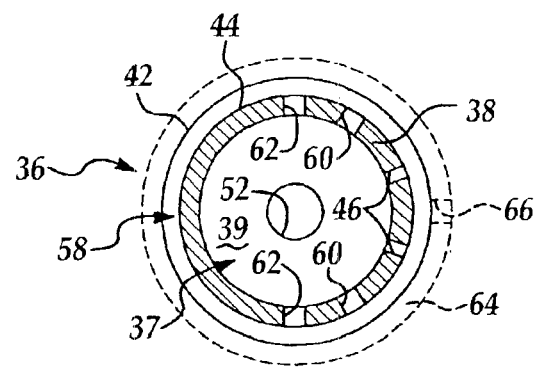
FIG. 4 is a cross-sectional view, taken along section lines 4—4 in FIG. 3, of an illustrative embodiment of the multi-inlet arc chamber of the present invention, illustrating a six-inlet configuration embodiment of the invention.

In the six-inlet configuration of FIG. 4, a pair of inside gas inlet openings 46, a pair of middle gas inlet openings 60 and a pair of outside gas inlet openings 62 extend through the chamber wall 38, typically at the neck 44 of the arc chamber 36, with the outside gas inlet openings 62 substantially diametrically opposed with respect to each other on opposite sides of the chamber wall 38. In application of the arc chamber 36 as hereinafter described, the arc chamber 36 is fitted inside a sleeve 64 which engages the lower flange 42 and the upper flange 40 to define a gas flow annulus 58 between the sleeve 64 and the neck 44 of the arc chamber 36. The sleeve 64 includes a gas entry opening 66 which opens into the gas flow annulus 58 typically at a point between the adjacent inside gas inlet openings 46, as illustrated in FIG. 4. Accordingly, the gas flow annulus 58 establishes fluid communication between the gas entry opening 66 and the gas inlet openings 46, 60, and 62.

Figure 5:
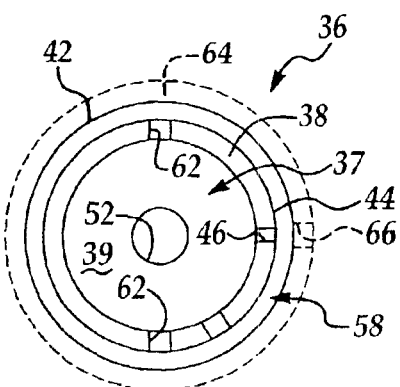
FIG. 5 is a cross-sectional view of another illustrative embodiment of the multi-inlet arc chamber, illustrating a three-inlet configuration embodiment of the present invention.

As further illustrated in FIG. 4, the diameter or width of the inside gas inlet openings 46 is typically smaller than that of the middle gas inlet openings 60, whereas the diameter or width of the middle gas inlet openings 60 is typically smaller than that of the outside gas inlet openings 62. While the diameter or width of the inside gas inlet openings 46, the middle gas inlet openings 60 and the outside gas inlet openings 62 may range typically from about 0.5 mm to about 5.0 mm, the diameter or width of the gas inlet openings preferably increases the further the gas inlet openings are located from the gas entry opening 66 of the sleeve 64. For example, the inside gas inlet openings 46 may have a diameter or width of at least about 0.5 mm; the middle gas inlet openings 60 may each have a diameter or width of at least about 1 mm; and the outside gas inlet openings 62 may have a diameter or width of from about 1.5 mm to about 5 mm. It is understood that the inside gas inlet openings 46, the middle gas inlet openings 60 and the outside gas inlet openings 62 may be located at any suitable location in the chamber wall 38 consistent with the purpose of the gas inlet openings, hereinafter described. The gas inlet openings 46, 60 and 62 may extend substantially horizontally through the chamber wall 38. The arc chamber 36 preferably includes at least three gas inlet openings extending through the chamber wall 38 thereof in substantially equidistant relationship with respect to each other, as illustrated in FIG. 5, in which case an inside gas inlet opening 46 is flanked by a pair of typically larger-diameter outside gas inlet openings 62. However, it is understood that the chamber wall 38 may alternatively have 4–8 or more of the gas inlet openings.

Figure 6:
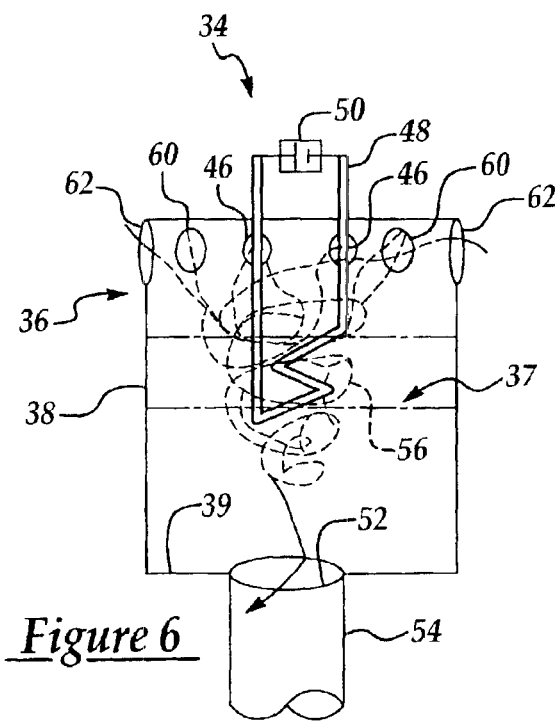
FIG. 6 is a schematic view illustrating turbulent flow of gas in application of the multi-inlet arc chamber of the present invention.

Referring next to FIG. 6, in application the multi-inlet arc chamber 36 of the present invention is used in a PFS (plasma flood system) 34 of a hi-current implanter such as that sold by the Applied Materials Corp. of Santa Clara, Calif. The PFS system 34 includes a filament 48 which is typically comprised of tungsten and extends downwardly into the chamber interior 37 of the arc chamber 36. A low voltage source 50 connects the ends of the filament 48, in conventional fashion. In operation, a plasma-forming gas, typically argon or xenon, flows first through the gas entry opening 66 of the sleeve 64, and then into the chamber interior 37 from the gas flow annulus 58 simultaneously through the inside gas inlet openings 46, the middle gas inlet openings 60 and the outside gas inlet openings 62. Because the gas inlet openings typically increase in diameter with increasing distance from the gas entry opening 66 of the sleeve 64, approximately equal quantities of the gas flows simultaneously through the inside gas inlet openings 46, the middle gas inlet openings 60 and the outside gas inlet openings 62 from the gas flow annulus 58. Accordingly, the gas travels in a generally spiral, turbulent path 56 around and against various points of contact on the filament 48. A typical flow rate of the gas into the chamber interior 37 through the gas inlet openings is from about 0.5 sccm to about 5 sccm, and preferably, about 1.2 sccm. While a gas flow rate of about 0.5 sccm is adequate to facilitate turbulent flow of the gas in the chamber interior 37, higher gas flow rates increase turbulent flow of the gas in the chamber interior 37. A typical pressure maintained inside the chamber interior 37 is about <10 Torr. Simultaneously, the low voltage source 50 generates a current of typically about 3 volts and about 200 amps flowing through the filament 48.

As the turbulent flowing gas contacts the filament 48, electrons are emitted from the gas and strike an arc of about 30 volts. The electrons and argon cations are drawn from the chamber interior 37 through the vacuum opening 52 in the chamber bottom 39 and through a vacuum conduit 54, respectively, after which the electrons enter an ion beam (not illustrated) which carries the electrons to the surface of a wafer (not illustrated) for neutralization of positive charges thereon, in conventional fashion.

It will be appreciated by those skilled in the art that the multiple gas inlet openings facilitate turbulent, rather than orderly, spiral flow of the plasma-forming gas in the chamber interior 37. Consequently, the flowing gas tends to contact various points rather than the same point or points on the filament 48 as the current flowing through the filament 48 causes the emission of electrons from the gas. As a result, the filament 48 is less susceptible to premature burnout and breakage, since the points of contact between the gas and the filament 48 are more numerous and spread out over a large segment of the filament 48, than is the case with respect to arc chambers having a single gas inlet opening. It has been found that using the multi-inlet arc chamber 36 of the present invention in plasma flood systems extends the lifetime of the filament 48 from 18 days to about 30 days or longer.

While the preferred embodiments of the invention have been described above, it will be recognized and understood that various modifications can be made in the invention and the appended claims are intended to cover all such modifications which may fall within the spirit and scope of the invention.

Having described our invention with the particularity set forth above, we claim:

What is claimed is:

1. A method of prolonging a lifetime of a filament in a plasma flood system for an ion implanter during a plasma flood operation, said method comprising:

providing a generally cylindrical arc chamber comprising a sleeve having a gas entry opening, a qenerally cylindrical chamber wall defining a chamber interior provided in said sleeve and a gas flow annulus defined between said sleeve and said chamber wall;

providing a plurality of gas inlet opening in said chamber wall in spaced-apart relationship to each other along at least a portion of a circumference of said chamber wall and in fluid communication with said gas flow annulus;

positioning the filament in said chamber interior;

transmitting a current through said filament; and introducing a plasma-forming gas into said plurality of gas inlet openings through said gas entry opening and said gas flow annulus at a gas flow rate of at least about 0.5 sccm, whereby said gas travels in a substantially turbulent path in said chamber interior and contacts said filament at multiple points of contact on said filament.

2. The arc chamber of claim 1 wherein said plurality of gas inlet openings comprises at least three gas inlet openings.

3. The method of claim 1 wherein said current is about 3 volts and about 200 amps.

4. The method of claim 3 wherein said plurality of gas inlet openings comprises at least three gas inlet openings.

5. The method of claim 1 wherein said gas flow rate is from about 1.2 sccm to about 5 sccm.

6. The method of claim 1 wherein said plurality of gas inlet openings comprises a first gas inlet opening, a second gas inlet opening and a third gas inlet opening disposed between said first gas inlet opening and said second gas inlet opening, and wherein said third gas inlet opening has a width smaller than a width of said first gas inlet opening and said second gas inlet opening, respectively.

7. The method of claim 6 wherein said width of said first gas inlet opening and said width of said second gas inlet opening, respectively, is at least about 1.0 mm and said width of said third gas inlet opening is at least about 0.5 mm.

\* \* \* \* \*